(12) United States Patent
Tanaka et al.

(10) Patent No.: US 7,492,817 B2
(45) Date of Patent: Feb. 17, 2009

(54) ADAPTIVE DIGITAL FILTER

(75) Inventors: Ryohei Tanaka, Osaka (JP); Toyokazu Kitano, Osaka (JP)

(73) Assignee: Daihen Corporation, Osaka (JP)

( * ) Notice: Subject to any disclaimer, the term of this patent is extended or adjusted under 35 U.S.C. 154(b) by 431 days.

(21) Appl. No.: 11/056,449

(22) Filed: Feb. 11, 2005

(65) Prior Publication Data
US 2005/0180497 A1  Aug. 18, 2005

(30) Foreign Application Priority Data
Feb. 12, 2004  (JP)  ............... 2004-035630

(51) Int. Cl.
*H03H 7/30*  (2006.01)
(52) U.S. Cl. ............... 375/232; 333/18; 333/28; 381/103; 708/323
(58) Field of Classification Search ............... 375/232
See application file for complete search history.

(56) References Cited

U.S. PATENT DOCUMENTS 5,483,552 A * 1/1996 Shimazaki et al. .......... 375/233
5,734,577 A * 3/1998 Chesir et al. ............... 342/159
2003/0195906 A1* 10/2003 Azadet et al. ............... 708/200
2007/0285442 A1* 12/2007 Higgins ...................... 345/690

FOREIGN PATENT DOCUMENTS

JP    6-188683    7/1994
JP    3092647     7/2000

* cited by examiner

*Primary Examiner*—Shuwang Liu
*Assistant Examiner*—Dhaval Patel
(74) *Attorney, Agent, or Firm*—Hamre, Schumann, Mueller & Larson, P.C.

(57) ABSTRACT

An adaptive digital filter includes a filtering circuit and a coefficient renewal circuit. The filtering circuit has a coefficient a defined by a fundamental formula: $a[n+1]=a[n]+\beta \cdot e[n] \cdot q[n]/p[n]$. $\beta$ is a number greater than 0 and smaller than 2, e[n] is a difference between the input and the output of the filter, and q[n] and p[n] are formulas. The renewal circuit calculates a renewal value of the coefficient a. The coefficient renewal circuit calculates $2^m$ (m is an integer) greater than p[n] in the fundamental formula, and also calculates the renewal value of the coefficient a in accordance with an execution formula: $a[n+1]=a[n]+\beta \cdot e[n] \cdot q[n]/2^m$ in place of the fundamental formula.

6 Claims, 14 Drawing Sheets

PRIOR ART

ADAPTIVE DIGITAL FILTER

BACKGROUND OF THE INVENTION

1. Field of the Invention

The present invention generally relates to a digital filter that passes a required frequency. In particular, the present invention relates to an adaptive digital filer provided with a coefficient renewal unit for minimizing the variation between input data and output data.

2. Description of the Related Art

FIG. 17 shows a conventional adaptive digital filter (generally indicated by reference numeral 100) which includes an IIR (infinite impulse response) digital filter 101 and a coefficient controller 102 for controlling the coefficient a to determine the central frequency of the pass band of the filter. Whenever digital data (sampling data) x[n] is inputted to the filter 101, calculation is performed to determine a coefficient a[n+1] which minimizes the difference e[n]=x[n]−y[n], where y[n] is an output from the filter. The calculation result is used for the filter 101 when the next digital data x[n+1] is inputted to the filter. In this manner, it is possible to allow only a desired frequency $f_0$ to pass through.

The renewal of the coefficient a[n+1] of the conventional filter 100 is performed in accordance with Formula (1) below:

$$a[n+1] = a[n] + \frac{\beta \cdot e[n] \cdot u[n-1]}{u[n]^2 + u[n-1]^2} \quad (1)$$

According to S. Haykin's 'Adaptive Filter Theory, 3rd ed. (published in 1996), when the factor β in Formula (1) satisfies 0<β<2, the renewal value a[n+1] of the coefficient a converges to a definite value.

FIG. 18 shows a circuit for calculating the coefficient a based on Formula (1). This coefficient calculating circuit includes a divisor calculator 103 (for determining the value of $u[n]^2+u[n-1]^2$), a dividend calculator 104 (for determining the value of e[n]·u[n−1]), a division circuit 105 (for determining the quotient $(e[n]\cdot u[n-1])/(u[n]^2+u[n-1]^2)$), a multiplier 106 (for calculating the product of the factor β and the quotient calculated by the division circuit 105), and an adder 107 (for adding the previously calculated a[n] and the calculation result from the multiplier 106).

Such a technique as described above is disclosed in JP-A-H06-188683 and JP-B2-3092647, for example.

The coefficient controller 102 of the conventional filter has been found disadvantageous in that the coefficient a is calculated by Formula (1), which makes the arrangements of the division circuit 105 complex and large. Accordingly, the calculation time tends to be unduly long.

More specifically, when the coefficient renewal calculation is performed in accordance with Formula (1), it is possible to calculate an accurate renewal value a[n+1]. However, the expected function of the coefficient controller 102 is to calculate a definite coefficient with which only a single frequency $f_0$ is allowed to pass the filter. Therefore, as long as the desired frequency filtering is attained, the coefficient renewal is not necessarily performed by Formula (1).

If Formula (1) could be replaced by a different formula which permits simple and high-speed digital processing, it would be possible to produce an adaptive digital filter with a simple and high-speed coefficient renewal circuit.

SUMMARY OF THE INVENTION

The present invention has been proposed under the circumstances described above. It is therefore an object of the present invention to provide an adaptive digital filter with a simple and high-speed coefficient renewal circuit.

According to the present invention, there is provided an adaptive digital filter comprising: a filtering circuit having a coefficient a defined by a fundamental formula: a[n+1]=a[n]+ β·e[n]·q[n]/p[n], where β is a number greater than 0 and smaller than 2, e[n] is a difference between a filter input and a filter output, and q[n] and p[n] are prescribed formulas; a coefficient renewal circuit that calculates a renewal value of the coefficient a upon input of sampling data to the filtering circuit and that renews the coefficient a by utilizing the calculated renewal value. The coefficient renewal circuit calculates $2^m$ (m is an integer) greater than p[n] in the fundamental formula, and also calculates the renewal value of the coefficient a in accordance with an execution formula: a[n+1]=a[n]+β·e[n]·q[n]/$2^m$ in place of the fundamental formula.

Preferably, $2^m$ in the execution formula is a minimum value greater than the p[n].

Preferably, the coefficient renewal circuit calculates the renewal value of the coefficient a by a fixed-point system. In this case, the coefficient renewal circuit comprises: a first calculator that detects an uppermost digit with a 1 set therein among digits of binary data representing the p[n], and calculates $2^m$ whose binary representation includes only a single 1 placed in a digit one higher than said uppermost digit; a bit shifting circuit for shifting respective bits of binary data representing a dividend divided by the p[n] in the fundamental formula, the shifting being performed toward a lower digit side by m bits to produce new binary data; and a second calculator that calculates the renewal value of the coefficient a by using said new binary data.

Preferably, the coefficient renewal circuit calculates the renewal value of the coefficient a by a floating-point system. In this case, the coefficient renewal circuit comprises: a data extracting circuit for extracting exponent data from each of binary data representing the p[n] and binary data representing a dividend divided by the p[n] in the fundamental formula; an exponent data generating circuit for generating increment data based on the extracted exponent data of the p[n], the increment data being greater than the extracted exponent data of the p[n] by 1; a subtracting circuit for calculating subtraction data by subtracting the increment data from the extracted exponent data of the dividend; a data changing circuit for changing the dividend by replacing exponent data of binary data representing the dividend with the subtraction data; and a coefficient calculating circuit for calculating the renewal value of the coefficient a by using binary data representing the changed dividend.

Preferably, the coefficient a determines a single frequency to pass through the filtering circuit.

Preferably, the adaptive digital filter of the present invention may further comprise a coefficient restricting circuit for restricting the coefficient a renewed by the coefficient renewal circuit so that the renewed coefficient falls in a prescribed numerical range.

According to the present invention, the conventional divisor of Formula (1) is replaced by $2^m$ which is greater than the conventional divisor. With this arrangement, it is possible to use a simple logic circuit for performing division processing in an adaptive digital filter.

Other features and advantages of the present invention will become apparent from the detailed description given below with reference to the accompanying drawings.

BRIEF DESCRIPTION OF THE DRAWINGS

FIG. 15 is a block diagram showing an example of NLMS calculator provided with a limiter for bounding the value of the coefficient a;

FIG. 16 illustrates how two following frequencies of an adaptive digital filter are different in the presence of a limiter in the renewal value calculator for the coefficient a;

DETAILED DESCRIPTION OF THE PREFERRED EMBODIMENTS

Figure 1:
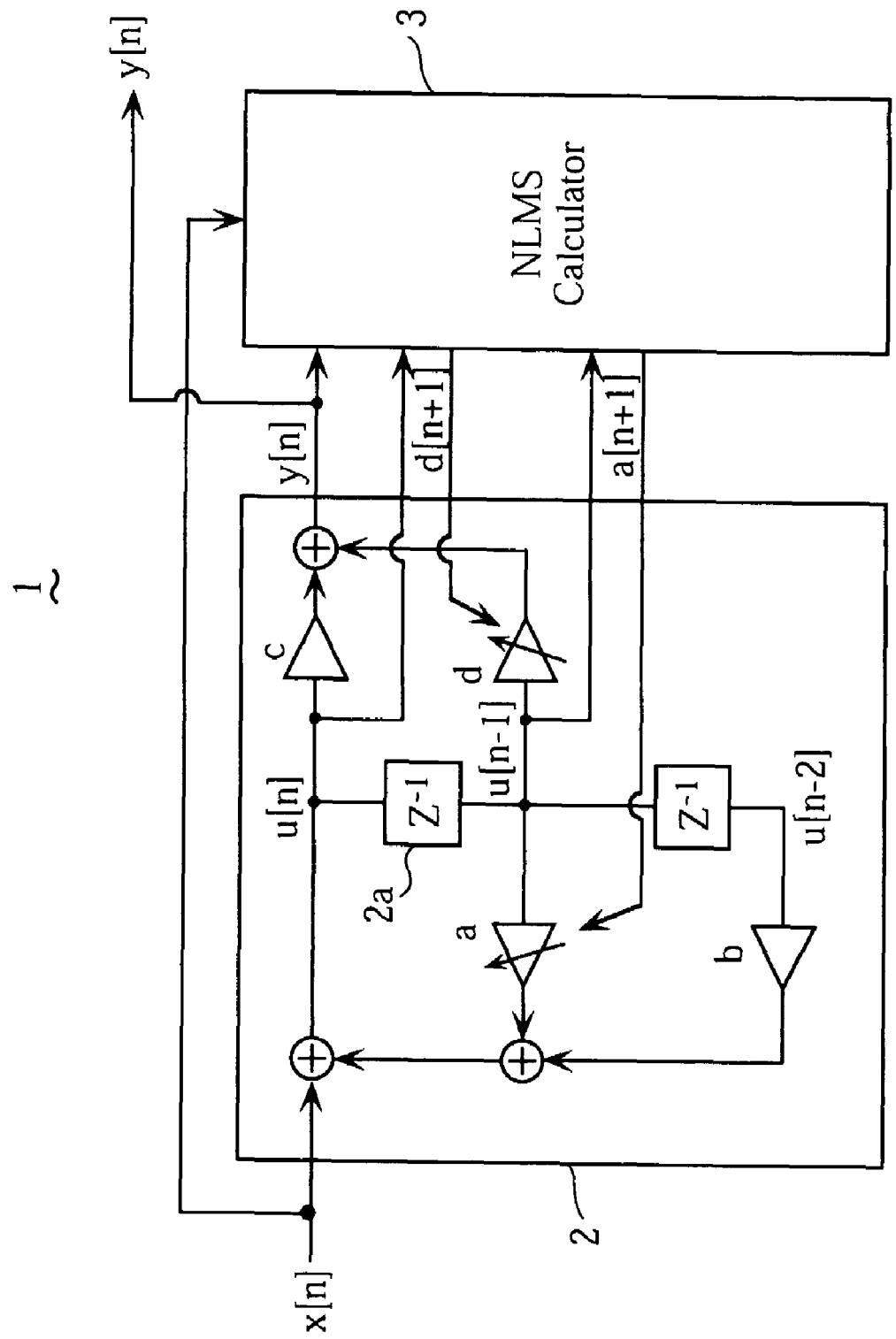
FIG. 1 is a block diagram showing an adaptive digital filter according to the present invention.

Preferred embodiments of the present invention will be described below with reference to the accompanying drawings.

As previously noted, the "output adjusting coefficient" of the conventional filter is renewed in accordance with Formula (1). According to the present invention, the output adjusting coefficient of a digital filter is renewed in accordance with Formula (2) given below, which is a modification of Formula (1). For better understanding the digital filter of the present invention, description is first made to Formula (2).

$$a[n+1] = a[n] + \frac{\beta \cdot e[n] \cdot u[n-1]}{2^m} \quad (2)$$

As known in the art, all information—words, images and numbers—is stored in and manipulated by a computer in the form of binary numbers. For example, suppose that a decimal number N is expressed as $a_n \times 2^n + a_{n-1} \times 2^{n-1} + \ldots + a^2 \times 2^2 + a^1 \times 2^1 + a^0 \times 2^0$. In the computer, the number N is denoted in the binary form as ($*a_n\, a_{n-1} \ldots a_2\, a_1\, a_0$), where the leftmost digit ($*$) represents the sign of the number. When the number is positive, the digit ($*$) is a 0, for example. When the number is negative, on the other hand, the digit ($*$) is a 1.

It is also known that a computer performs calculations in either the fixed-point format or floating-point format. In the fixed-point format, the division of the above number N by a divisor M ($=2^m$; n>m) gives $a_n \times 2^{n-m} + a_{n-1} \times 2^{n-1-m} + \ldots + a_m \times 2^{m-m}$, which is ($* \ldots * a_n\, a_{n-1} \ldots a_m$) in binary. This binary representation can be obtained simply by shifting the respective bits of the dividend N to the right m times. As a result of the shifting, the leftmost m bits would become void without taking any counter measurements. To avoid this problem, the sign bit data is put into each of the leftmost m bits, as shown by the series "$* \ldots *$" in the binary representation ($* \ldots * a_n\, a_{n-1} \ldots a_m$). This sign bit data is calculated by the exclusive OR of the sign bits of the dividend N and the divisor M.

As an example, suppose that the decimal number N is "+30" and the decimal number M is "+4 ($=2^2$)". Since 30 is expressed as $1 \times 2^4 + 1 \times 2^3 + 1 \times 2^2 + 1 \times 2^1 + 0 \times 2^0$, its 8-bit binary representation is (00011110), where the leftmost bit '0' is the sign bit data. The division of (00011110) by 4 ($=2^2$) is obtained by shifting the respective bits to the right twice, which gives (00000111). This binary number is equal to 7 in decimal. The leftmost 0 is the sign bit data, and the next two 0s are the copy of the sign bit data.

The above fact is applied for modifying Formula (1). Specifically, the denominator $(u[n]^2+u[n-1]^2)$ of the second term in Formula (1) is replaced by $e[n] \cdot u[n-1]/2m$. As a result, the calculator (division circuit, in particular) for the coefficient a[n] can be easily realized by a shift circuit to shift the bits of the dividend. It should be noted here that the dividend of the second term is not limited to the product $e[n] \cdot q[n]$, but may be a single element or any combination of the tree elements: $\beta$, $e[n]$ and $u[n-1]$.

On the other hand, in the floating-point system, the numerical data format is defined by $k \times 2n$, and the numerical data consists of the uppermost bit (sign bit), the subsequent eight bits (representing the exponent value n), and the remaining bits (representing the mantissa value k). When the dividend N1 is $k1 \times 2n$ and the divisor N2 is $k2 \times 2m$, the quotient N1/N2 is equal to $(k1/k2) \times 2n-m$. Thus, if the mantissa k2 of the divisor N2 is not a 1, the calculation of (k1/k2) can be very complicated.

In light of the above, according to the present invention, the divisor N2 is replaced by 2r (r is determined such that 2r is greater than $k2 \times 2m$). In this manner, the quotient N1/N2, $k1 \times 2n-r$, can be easily obtained by subtracting the exponent r of the divisor N2 from the exponent n of the dividend N1. Again, in the floating-point system, the exponent data n of the dividend and the exponent data r of the divisor are extracted, and then a subtracting unit is used for calculating the difference (n−r). This result is put into the exponent data of the dividend, while the sign bit data of the dividend is replaced by the result of the exclusive OR of the dividend's sign bit data and the divisor's sign bit data. In this way, it is easy to realize the division processing circuit.

In this connection, it should be appreciated that the floating-point system does not require the sign bit replenishing operation which is needed to be performed in the fixed-point system for dealing with the occurrence of void data bits due to the right-shifting of the bits. In the floating-point system, as described above, only the exponent data of the dividend N1 is replaced by the difference (n−r), but no right-shifting of the bits is performed.

As described above, the replacement of the divisor=$2^m$ makes it possible to make a simple division circuit and perform fast processing. In light of this, a coefficient controller used in an adaptive digital filter of the present invention is designed to renew the coefficient a[n] in accordance with Formula (2):

$$a[n+1] = a[n] + \frac{\beta \cdot e[n] \cdot u[n-1]}{2^m} \quad (2)$$

In Formula (2), the value of $2^m$ (and hence the value of m) is determined so that the renewed coefficient a[n+1] will converge to a certain number. For Formula (1), the condition for convergence is $0<\beta<2$. From this inequality, the following inequality is obtained:

$$0<\beta/(u[n]^2+u[n-1]^2)<2/(u[n]^2+u[n-1]^2).$$

This provides the new condition for convergence of a[n+1]: If the quotient β/X, which should be positive, is smaller than $2/(u[n]^2+u[n-1]^2)$, then the coefficient a[n+1] will converge to a definite number. Now let X be $2^m$ and m is determined so that $2^m$ is greater than $(u[n]^2+u[n-1]^2)$. In this case, β/X (i.e. $\beta/2^m$) can be smaller than $2/(u[n]^2+u[n-1]^2)$, since $\beta/2^m<\beta/(u[n]^2+u[n-1]^2)<2/(u[n]^2+u[n-1]^2)$. Thus, for proper convergence of the coefficient a[n+1], $2^m$ need be a number greater than $(u[n]^2+u[n-1]^2)$. It should noted here that Formula (2) is a substitutional approximation of Formula (1), and therefore the difference of these formulas should be as small as possible. Thus, according to the present invention, $2^m$ is the smallest integer that is greater than $(u[n]^2+u[n-1]^2)$.

For example, $(u[n]^2+u[n-1]^2)$ is equal to, say, 30 in decimal. The minimum $2^m$ greater than 30 is 32, and therefore m=5.

Next, an adaptive digital filter according to the present invention is described. FIG. 1 is a block diagram showing basic components used in an adaptive digital filter of the present invention.

The illustrated digital filter 1 includes an IIR digital filtering circuit 2 and an NLMS (Normalized Least Mean Square) calculator 3. The NLMS calculator 3 computes coefficient a and a coefficient d in the IIR digital filtering circuit 2 by an NLMS algorithm.

The filtering circuit 2 is a known second-order IIR filter consisting of a feedback part and a feedforward part connected in cascade. The filtering circuit 2 has a resonance characteristics with respect to a prescribed single frequency. In the feedback part (the part from the delay circuit 2a to the data input side), calculation is performed to extract a signal of frequency $f_o$. In the feedforward part (the part from the delay circuit 2a to the data output side), calculation is performed to determine the phase and amplitude of the extracted signal.

The coefficient b in the feedback part is determined in accordance with the conventional formula: $b=-r^2$. Likewise, the coefficients c and d in the feedforward part are determined in accordance with the conventional formulas: $c=1-r^2$ and d[n+1]=(r−1)·a[n+1], respectively. In the present embodiment, r is constant, so that the coefficients b and c are fixed.

As shown in FIG. 1, digital data x[n] (data of sampling number n) is inputted to the filtering circuit 2 and the NLMS calculator 3. The NLMS calculator 3 receives digital data y[n] from the filtering circuit 2, while also receiving input data u[n] to and output data u[n−1] from the delay circuit 2a. The calculator 3 calculates the difference between the input data x[n] and the output data y[n], that is, the variation e[n]=x[n]−y[n], which corresponds to the difference of level. Further, using the variation data e[n], input data u[n] and output data u[n−1], the NLMS calculator 3 calculates the renewal value a[n+1] of the coefficient a and the renewal value d[n+1] of the coefficient d in accordance with the above-mentioned formulas. The results of the calculation are fed back to the filtering circuit 2 for the coefficient a and the coefficient d.

Figure 2:
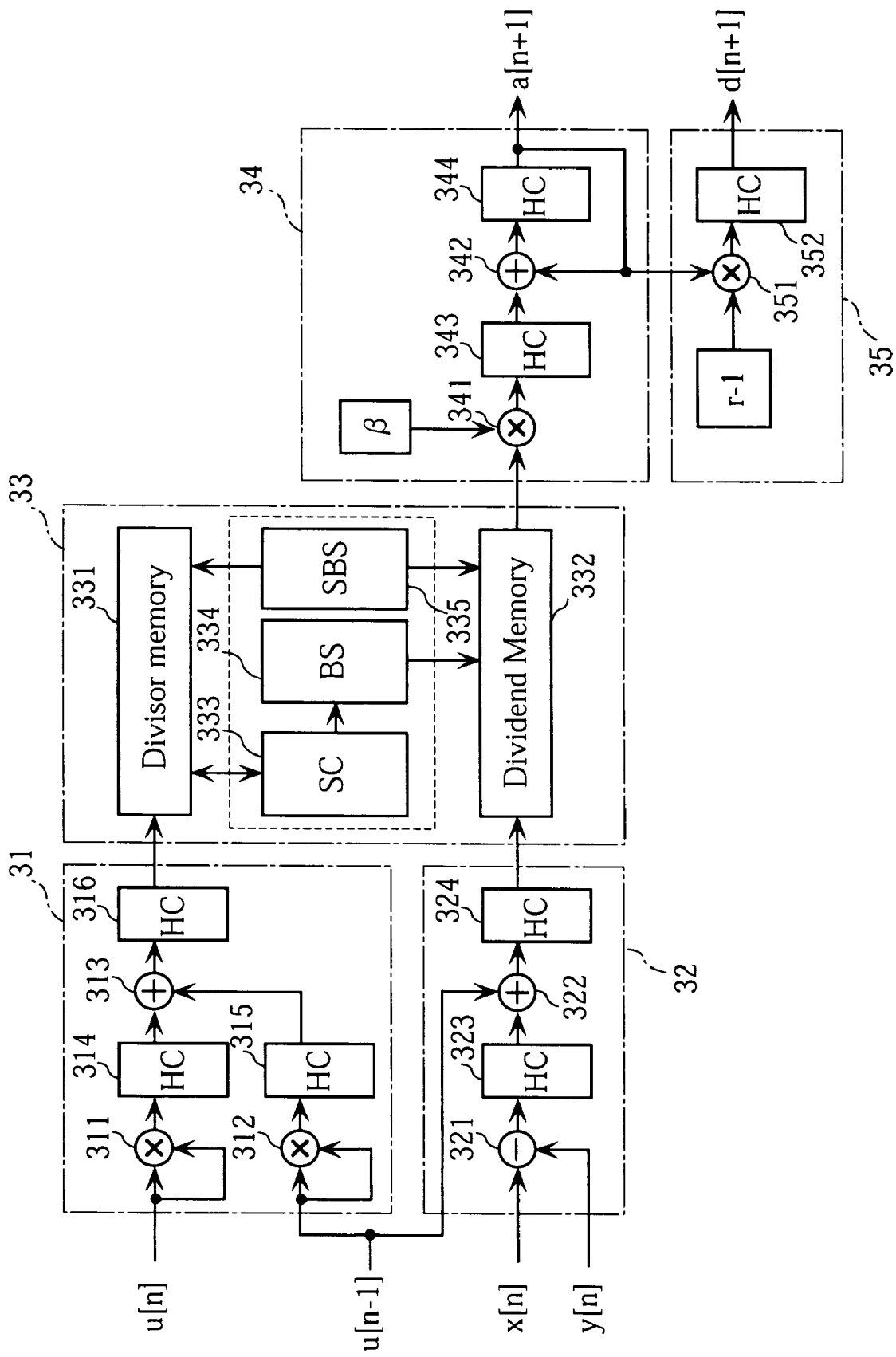
FIG. 2 is a block diagram showing basic components of an NLMS calculator that calculates renewal values a[n+1], d[n+1] of coefficients a, d in a fixed-point system.

FIG. 2 shows the basic components of a NLMS calculator designed for renewal of the coefficients a and d in a floating-point system.

In the figure, the block 31 is a denominator calculating unit for determining the value of the denominator $(u[n]^2+u[n-1]^2)$ of the second term in Formula (1), while the block 32 is a numerator calculating unit for determining the value of the numerator (e[n]·u[n−1]) of the second term in Formula (1). The block 33 is a division processing unit. In this unit, calculation is performed for determining the minimum $2^m$ that is greater than the value of $(u[n]^2+u[n-1]^2)$. Then, based on the minimum value $2^m$ and the value of e[n]·u[n−1] (outputted from the numerator calculating unit 32), the division processing unit or block 33 performs the calculation of the second term (i.e. division) in Formula (2).

The block 34 is a first coefficient calculating unit for calculating the renewal value a[n+1] of the coefficient a in accordance with Formula (2), using the calculation result from the division processing unit 33 and the previously calculated coefficient value a[n]. The block 35 is a second coefficient calculating unit for calculating the renewal value d[n+1] of the coefficient d in accordance with the formula d[n+1]=(r−1)·a[n+1], using the predetermined constant r and the renewal value a[n+1] calculated by the first coefficient calculating unit 34.

In the denominator calculating unit 31, a first square calculator and a second square calculator are provided. The first square calculator is composed of a multiplication circuit 311 and a data holding circuit 314 that stores calculation results from the multiplication circuit 311. With this arrangement, the first square calculator calculates the square of data u[n]. Likewise, the second square calculator is composed of a multiplication circuit 312 and a data holding circuit 315 that stores calculation results from the multiplication circuit 312. With this arrangement, the second square calculator calculates the square of data u[n−1]. Further, the denominator calculating unit 31 includes an adder composed of an addition circuit 313 and a data holding circuit 316 that stores calculation results from the addition circuit 313. The adder performs addition of $u[n]^2$ and $u[n-1]^2$.

The first square calculator receives data u[n], and this data is inputted to the multiplication circuit 311 via two ways, one for a multiplicand and the other for a multiplier. With this arrangement, the multiplication circuit 311 calculates the square of data u[n], and the calculation result is stored in the data holding circuit 314. Meanwhile, the second square calculator receives data u[n−1], and this data is inputted to the multiplication circuit 312 via two ways, one for a multiplicand and the other for a multiplier. With this arrangement, the multiplication circuit 312 calculates the square of data u[n−1], and the calculation result is stored in the data holding circuit 315.

The stored $u[n]^2$ data and $u[n-1]^2$ are inputted to the addition circuit 313 to be added. The result of the addition (that is, $u[n]^2+u[n-1]^2$) is stored in the data holding circuit 316. Then, the store data is supplied to the division processing unit 32.

In the numerator calculating unit 32, a calculator of variation data e[n] is composed of a subtraction circuit 321 and a data holding circuit 323 that stores calculation results from the subtraction circuit 321. Further, a calculator for the numerator of the second term in Formula (2) is composed of a multiplication circuit 322 and a data holding circuit 324 that stores calculation results from the multiplication circuit 322.

The subtraction circuit 321 receives input data x[n] to the IIR digital filtering circuit 2 and output data y[n] from the filtering circuit 2. Upon receiving these two pieces of data, the subtraction circuit 321 calculates the value of (x[n]−y[n]), and the result e[n](=x[n]−y[n]) is stored in the data holding circuit 323. Then, the stored variation data e[n] is inputted to the multiplication circuit 322 as multiplicand data, while data u[n−1] is inputted to the circuit 322 as multiplier data. Upon receiving these two pieces of data, the multiplication circuit 322 calculates the value of e[n]·u[n−1]. The result of this calculation is stored in the data holding circuit 324, and then supplied to the division processing unit 33.

The division processing unit 33 includes a divisor memory 331, a dividend memory 332, a shift calculator (SC) 333, a bit shifter (BS) 334, and a sign bit setter (SBS) 335. Specifically, the divisor memory 331 stores the calculated value $(u[n]^2+u[n-1]^2)$ supplied from the denominator calculating unit 31. The dividend memory 332 stores the calculated value $(e[n]·u[n-1])$ supplied from the numerator calculating unit 32. The shift calculator 333 calculates the minimum $2^m$ (more precisely, the exponent m) which is greater than the divisor $(u[n]^2+u[n-1]^2)$. The bit shifter 334 causes the respective numerical bits of the data stored in the dividend memory 332 to shift to the right side (i.e. to the lower bit side) based on the calculation result of the shift calculator 333. As a result of this bit shifting, some 'void bits' are left between the uppermost bit (i.e. sign data bit) and the leftmost bit of the numerical data in the dividend data. The sign bit setter 335 copies the sign bit of the dividend data and pastes it into the void bits mentioned above.

The divisor memory 331 and the dividend memory 332 are made up of shift registers, while the shift calculator 333, the bit shifter 334 and the sign bit setter 335 are made up of operation circuits for executing preset processing programs, that is, programs for calculating the division of $(e[n]·u[n-1])/2^m$.

Figure 3:
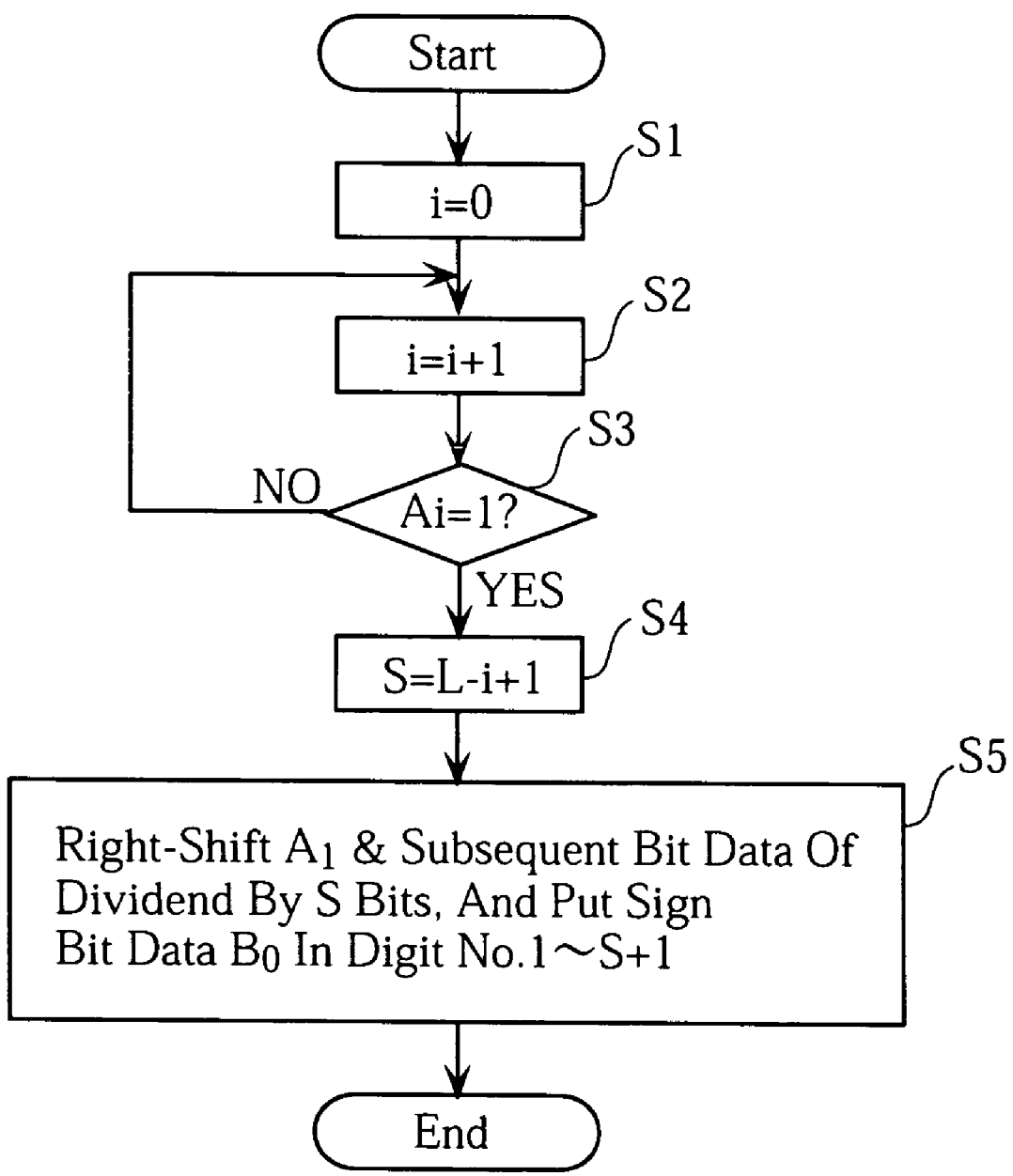
FIG. 3 shows a flow chart illustrating how the division processing is performed in the fixed-point system.

Reference is now made to FIG. 3 showing a flow chart that illustrates how the processing in the division processing unit 33 is performed.

Figure 4:
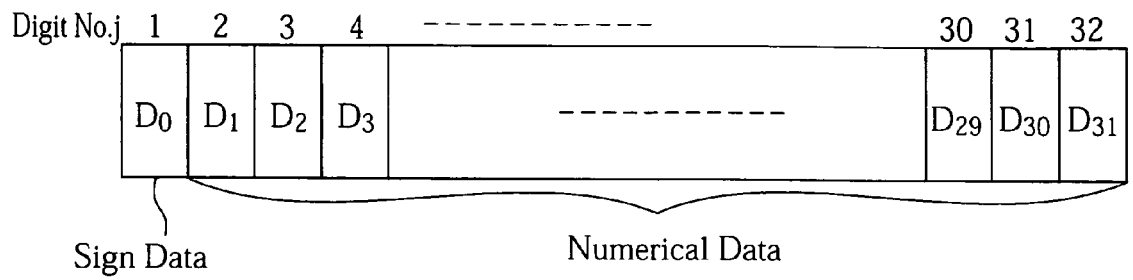
FIG. 4 shows an example of 32-bit data to be processed in the fixed-point system.

Supposing that the division processing unit 33 handles a 32-bit binary number $D_0D_1D_2 \ldots D_{31}$, as shown in FIG. 4, the leftmost 1 bit data $D_0$ is sign data (representing + or −), while the remaining right-side 31 bits data $D_1D_2 \ldots D_{31}$ is numerical data.

In the following explanation, the divisor is represented by a binary notation $A_0A_1A_2 \ldots A_{31}$, and the dividend is represented by a binary notation $B_0B_1B_2 \ldots B_{31}$.

In the flow chart, first, the count number i for counting the bit number is set to a 0 (S1). Then, the count number is incremented by 1 (S2), and the bit data $A_1$ is extracted from the divisor stored in the divisor memory 331 to determine whether the bit data $A_1$ is a 1 or not (S3). When the bit data $A_1$ is a 0 (S3: NO), the procedure returns to Step S2, to increase the counter number by 1. Then, it is determined whether the next bit data A2 is a 1 or not (S3).

In this manner, the same procedure is repeated whenever the bit number i is incremented by 1, to find the first bit number i at which the bit is 1 (the loop of S2 and S3). If Ai=1 (S3:YES), the procedure goes to Step S4, to calculate the shift number S (indicating how many times the right-shifting is to be performed) in accordance with the formula S=L−i+1, where L is the total bit of data (L=32 in the example shown in FIG. 4). The calculation result is temporally stored in a memory (not shown) in the sign bit setter 335.

By the S2 through S4 procedure, the exponent m, for which $2^m$ is a minimum which is greater than $(u[n]^2+u[n-1]^2)$, is determined, and based on this exponent m, the shift number S for performing the right-shifting of the dividend is calculated.

Figure 5:
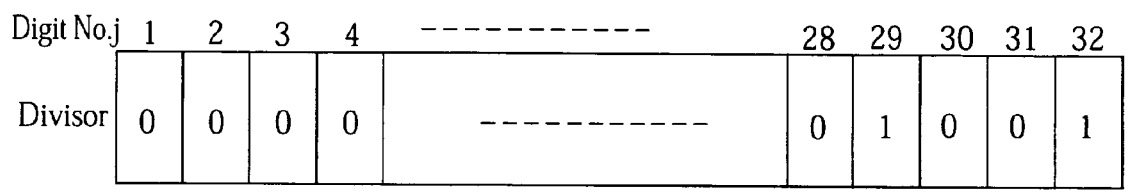
FIG. 5 shows an example of 32-bit divisor data.

For example, the divisor is 9 in decimal. In the binary notation, as shown in FIG. 5, the divisor is represented as (0000 . . . 01001), where only $A_{28}$ and $A_{31}$ are a 1. The minimum $2^m$ greater than 9 is 16 (=$2^4$), which is represented as (0000 . . . 10000), where only $A_{27}$ is 1.

In general, the minimum $2^m$ greater than the divisor has a 1 only for the bit data $A_{r-1}$, where r is the minimum bit number of the divisor for which the bit is a 1. In the above example, the divisor has two 1s for $A_{28}$ and $A_{31}$, wherein 28 is the minimum among a set of {28, 31}. Thus, in the above case, r=28. Therefore, the minimum $2^m$ has a 1 only for $A_{28-1(=27)}$ in binary notation.

The 32-bit binary number having a 1 only for Ar is equal to $2^{32-r-1}$ in decimal. Thus, the minimum $2^m$ greater than the divisor is $2^{32-r}$, and therefore m or shift number S is equal to 32−r. In the above example, since r=28, the shift number S is equal to 32−28=4.

As readily understood, the digit number j can be used in place of the bit number r by taking the numerical relationship r=j−1 into account. Since S=32−r, S=32−(j−1)=33−j. In the example shown in FIG. 5, since j=29, S=33−29=4.

Figure 6:
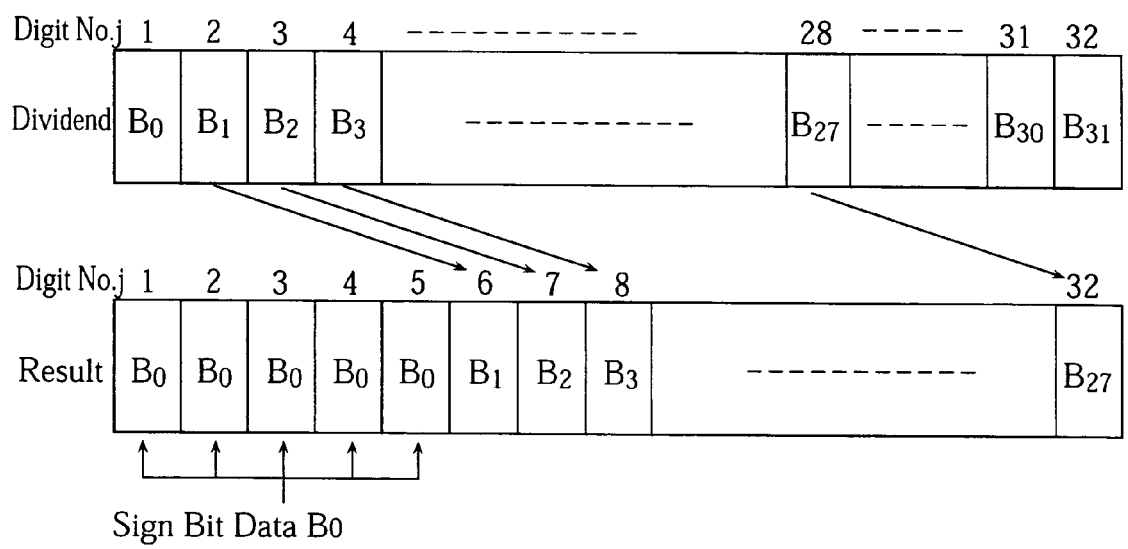
FIG. 6 shows the relationship between 32-bit dividend data and 32-bit quotient data.

Referring back to the flow chart of FIG. 3, after the shift number S is determined, the bit data $B_1, B_2, B_3, \ldots$ of the dividend stored in the memory 332 are shifted to the right side (lower digit side) by S bits (see FIG. 6). Meanwhile, the digits of the digit numbers 1 through S+1 stored in the dividend memory 332 are caused to have the same data as the sign bit data $B_0$ (S5). With this, the division of $(e[n]·u[n-1])/2^m$ ends. In the example of FIG. 5, the shift number S is 4, whereby the division causes the bit data $B_1$~$B_{27}$ of the dividend to shift to the right by 4 bits, and the five leftmost bits (bit numbers 0~4 or digit numbers 1~5) have the sign bit data $B_0$.

Referring to FIG. 2, in the first coefficient calculator 34, a calculator for the second term $(\beta·e[n]·u[n-1]/2^m)$ of Formula (2) is made up of the multiplication circuit 341 and the data holding circuit 343 that stores calculation results from the circuit 341. Further, a calculator for the renewal value of a[n+1] of the coefficient a is made up of the addition circuit 342 and the data holding circuit 344 that stores calculation results from the addition circuit 342.

The multiplication circuit 341 receives the quotient value of $e[n]·u[n-1]/2^m$ from the division calculating unit 33 and the preset coefficient β, to calculate the product of the quotient value and the coefficient β. The result $\beta·(e[n]·u[n-1]/2^m)$ is stored in the data holding circuit 343, while it is inputted to the addition circuit 342. While receiving the result $\beta·(e[n]·u[n-1]/2^m)$, the addition circuit 342 also receives the previously calculated coefficient a[n] from the data holding circuit 344, to calculate $\{\beta·(e[n]·u[n-1]/2^m)+(the\ coefficient\ a[n])\}$. The result of this addition, in other words, the renewal value a[n+1] of the coefficient a is stored in the data holding circuit 344 and outputted to the IIR digital filtering circuit 2.

In the second coefficient calculator 34, a calculator for the renewal value d[n+1] of the coefficient d is made up of the multiplication circuit 351 and the data holding circuit 342 that stores calculation results from the multiplication circuit 351. The multiplication circuit 351 receives the preset numerical data (r−1) and the renewal value a[n+1] of the coefficient a from the data holding circuit 344. Upon receiving these pieces of data, the multiplication circuit 351 calculates the product (r−1)·a[n+1]. The calculation result is stored in the data holding circuit 352 and outputted to the IIR digital filtering circuit 2.

Figure 7:
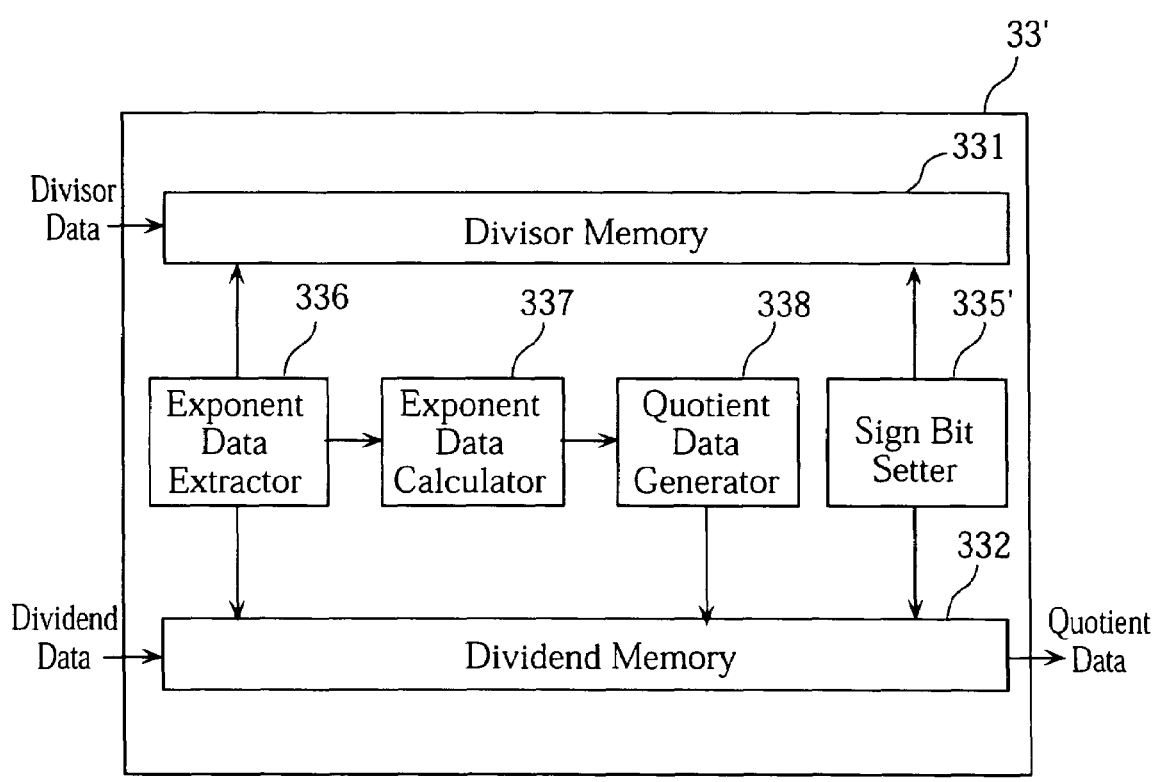
FIG. 7 is a block diagram showing a division calculator used for calculating the coefficient renewal values a[n+1], d[n+1] in a floating-point system.

Reference is now made to FIG. 7 illustrating a division processing unit 33' of the NLMS calculator 3 designed for calculating the coefficients a and d in a floating-point system. This NLMS calculator for handling floating-point numbers is different from the previously described NLMS calculator for handling fixed-point numbers (see FIG. 2) only in the design of the division processing unit.

The division processing unit 33' includes a divisor memory 331, a dividend memory 332, a sign bit setter 335', an exponent data extractor 336, an exponent data calculator 337, and a quotient data generator 338. Specifically, the divisor memory 331 stores the calculated value $(u[n]^2 + u[n-1]^2)$ from the denominator calculating unit 31. The dividend memory 332 stores the calculated value $(e[n] \cdot u[n-1])$ from the numerator calculating unit 32. The sign bit setter 335' determines the sign bit of the quotient and replaces the initial sign bit of the dividend in the memory 332 by the determined sign bit. The exponent data extractor 336 extracts the exponent bit data from the divisor data stored in the divisor memory 331, while also extracting the exponent bit data from the dividend data stored in the dividend memory 332. The exponent data calculator 337 calculates the exponent data of the quotient by using the exponent data extracted from the dividend and the divisor. The quotient data generator 338 generates multiplication data by replacing the exponent data of the dividend stored in the memory 332 by the calculated exponent data from the exponent data calculator 337.

The divisor memory 331 and the dividend memory 332 are made up of shift registers. The sign bit setter 335', the exponent data extractor 336, the exponent data calculator 337 and the quotient data generator 338 are made up of operation circuits to execute programs for calculating the quotient $(e[n] \cdot u[n-1])/2^m$ in the floating-point system.

Figure 8:
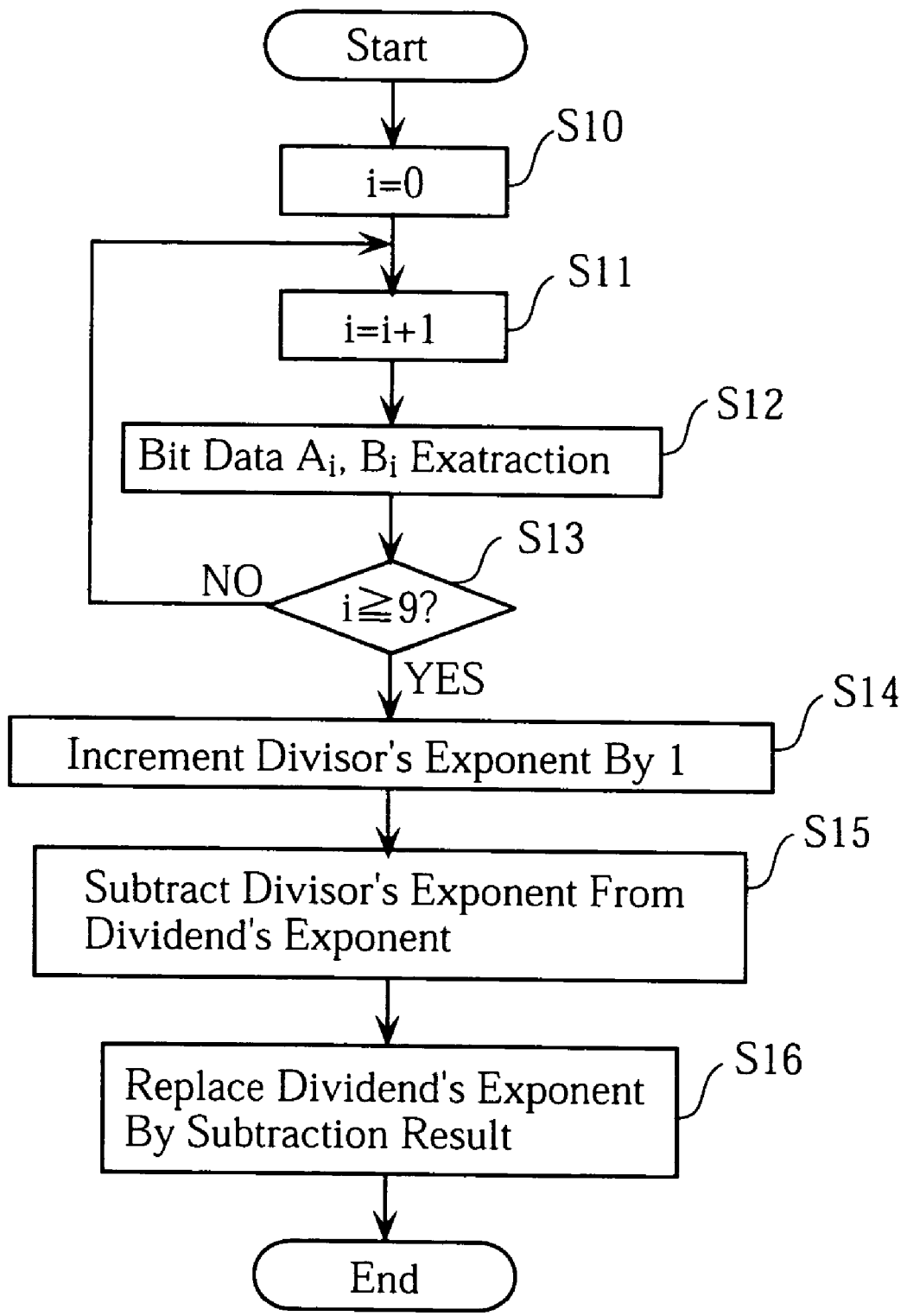
FIG. 8 shows a flow chart illustrating how the division processing is performed in the floating-point system.
Figure 9:
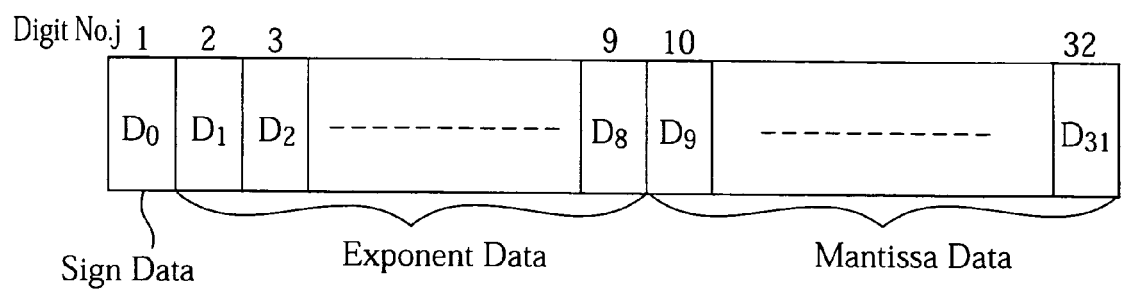
FIG. 9 shows an example of 32-bit data to be processed in the floating-point system.

FIG. 8 shows a flow chart illustrating how division processing in the circuit 33' is performed.

Supposing that 32-bit binary data handled in the circuit 33' is expressed as $D_0 D_1 D_2 \ldots D_{31}$ in the floating-point system, the leftmost one bit data $D_0$ is sign data, the next 8-bit data $D_1 D_2 \ldots D_8$ is numerical data representing the exponent, and the remaining 23-bit data $D_9 D_{10} \ldots D_{31}$ is numerical data representing the mantissa. In this instance again, the index i of 'Di' is a bit number to specify the bit data. The divisor in binary is expressed as $A_0 A_1 A_2 \ldots A_{31}$, while the divided in binary is expressed as $B_0 B_1 B_2 \ldots B_{31}$.

First, the counter value i for counting the bit number is set to '0' (S10). Then, the counter value i is incremented by 1 (S11). Meanwhile, bit data $A_1$ is extracted from the divisor data stored in the divisor memory 331, while bit data $B_1$ is extracted from the dividend data stored in the dividend memory 332, and these extracted pieces of data are temporarily stored in a memory (not shown) provided in the exponent data extractor 336 (S12). Then, it is determined whether the counter number i is equal to or greater than 9 (S13). If i<9 (S13:NO), the processing goes back to Step 11, whereby the counter number i is incremented by 1. Then, the extraction of bit data $A_2$ and bit data $B_2$ is performed (S13).

Thereafter, the same procedure is repeated with stepwise one increment of the bit number i, whereby the exponent bit data $(A_1 A_2 \ldots A_8)$ and $(B_1 B_2 \ldots B_8)$ are extracted from the divisor bit data (stored in the memory 331) and the dividend bit data (stored in the memory 332), respectively (S11-S13).

After the extraction of the exponent bit data is over (S13: YES), the exponent bit data $(A_1 A_2 \ldots A_8)$ of the divisor is changed to bit data $(a_1 a_2 \ldots a_8)$ which is greater than the original data $(A_1 A_2 \ldots A_8)$ by 1 (S14). Then, the subtraction of the exponent bit data $(a_1 a_2 \ldots a_8)$ from the exponent bit data $(B_1 B_2 \ldots B_8)$ of the dividend is performed (S15). Specifically, for executing this subtraction, the complement of the data $(a_1 a_2 \ldots a_8)$ is generated, and this complement data is added to the bit data $(B_1 B_2 \ldots B_8)$. As a result, subtraction data $(C_1 C_2 \ldots C_8)$ is obtained.

Figure 10:
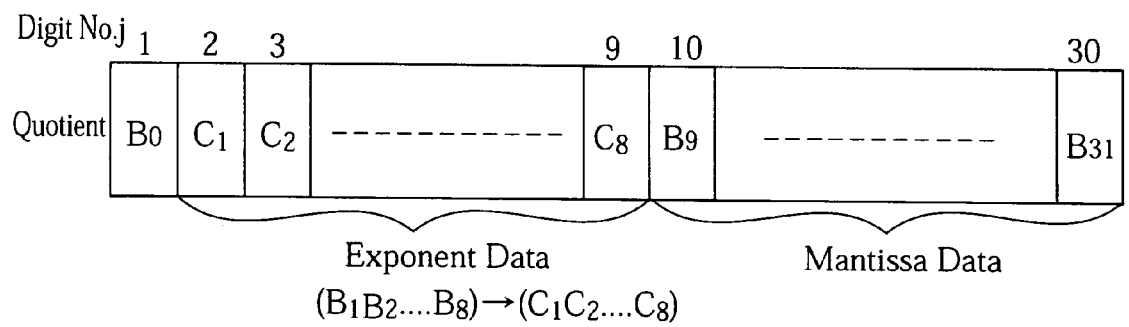
FIG. 10 shows bit data of a quotient generated from the dividend bit data in the floating-point system.

Then, as shown in FIG. 10, the exponent bit data $(B_1 B_2 \ldots B_8)$ of the divided is replaced by the subtraction data $(C_1 C_2 \ldots C_8)$ calculated at S15 (S16). With this, the calculation of quotient $(e[n] \cdot u[n-1])/2^m$ ends.

In the above-described embodiment, the numerator of the quotient in Formula (2) is $e[n] \cdot u[n-1]$, though the present invention is not limited to this. Specifically, the numerator may be a selected one of the three terms β, e[n] and u[n−1], or any combination of two or three terms. For example, the division processing unit 33 may calculate the quotient $(\beta \cdot e[n] \cdot u[n-1])/2^m$.

According to the present invention, the renewal value a[n+1] of the coefficient a for controlling the passable frequency $f_0$ is calculated by Formula (2), where the divisor $2^m$ is greater than $(u[n]^2 + u[n-1]^2)$ of Formula (1) but the minimum among such numbers. With such an arrangement, the division circuit of the NLSM calculator 3 is made simple and compact and yet capable of performing high-speed processing.

In particular, when the renewal value of a[n+1] is calculated in the fixed-point system, the required quotient is calculated simply by shifting the data bits of the dividend to the right by m times. Thus, the division circuit can be simply composed of shift registers and bit shifters. In the floating-point system, the required quotient is calculated by subtracting the exponent data of the divisor from the exponent data of the dividend, and then replacing the exponent data of the dividend by the result of the subtraction. Thus, the division circuit can be simply composed of a subtraction circuit and a bit data changing circuit.

In the above embodiments, the adaptive digital filter is an IIR digital filter. However, the present invention is not limited to this, and it can be applied to a FIR (finite impulse response) digital filter, for example.

Further, in the above embodiments, the renewal value calculation is performed with respect to the coefficient a that determines a filter-passable frequency. The present invention, however, is not limited to this, but is applicable to determination of other coefficients or factors regulated by a formula c[n+1]=c[n]+β·e[n]·q[n]/p[n].

In the adaptive digital filter, the coefficient a[n] is automatically adjusted to pass only an alternating signal of a particular frequency among other inputted signals. In other words, the adaptive filter substantially follows the particular frequency and allows the passage of this frequency only. Such a filter can be used in a signal line (through which alternating signals are transmitted) for detecting only one selected signal of a particular frequency.

Figure 11:
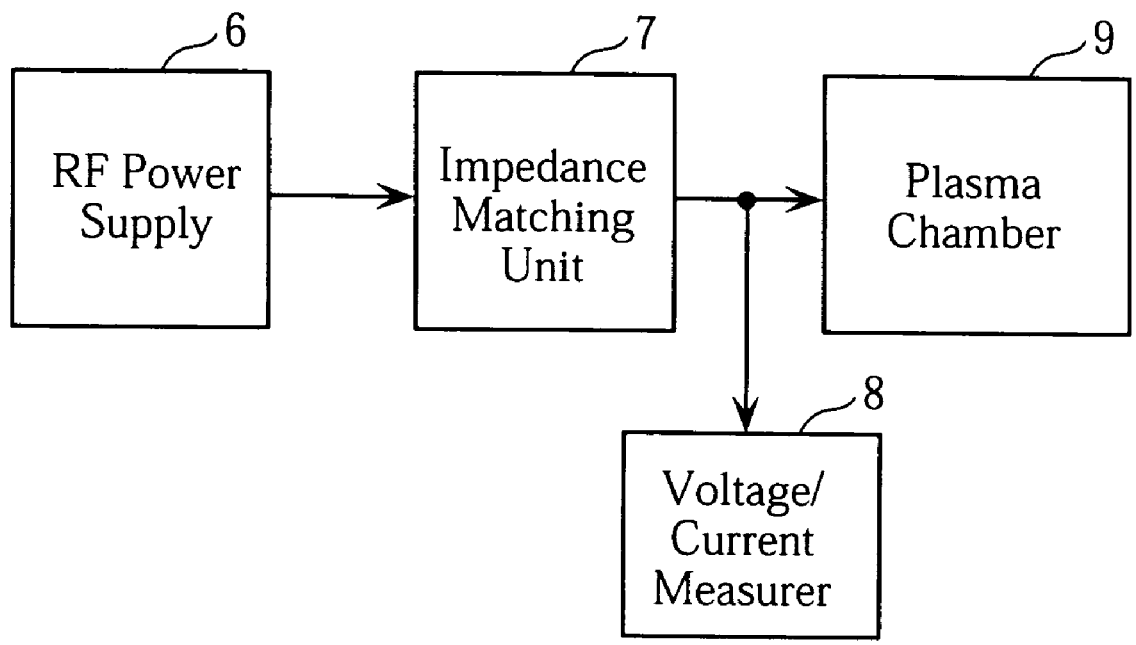
FIG. 11 is a block diagram showing a plasma processing system.

FIG. 11 shows a plasma processing system including an RF power supply 6, an impedance matching unit 7, a voltage/current measurer 8 and a plasma chamber 9. The power supply 6 produces RF (radio frequency) signals to be supplied to the plasma chamber 9 via the impedance matching unit 7. In the plasma chamber 9, plasma etching is performed with respect to semiconductor wafers. The voltage/current measurer 8 is provided between the impedance matching unit 7 and the plasma chamber 9. The v/c measurer 8 measures RF voltage and current signals at the input terminals of the plasmas chamber 9.

The RF power supply 6 of the illustrated plasma processing system outputs an RF signal of a single frequency (13.56

MHz, for example) which is supplied to the plasma chamber 9 via the impedance matching unit 7. In a recent RF power supply, the frequency of RF signals is not set to 13.56 MHz, but is variable in a range of ±2 MHz. In another processing system, an RF signal of 2 MHz is supplied from the plasma chamber 9 toward the RF power supply 6.

When the frequency of the RF signal from the power supply 6 is variable, the v/c measurer 8 need be able to follow the target frequency. With the use of an adaptive digital filter according to the present invention, it is possible to produce a frequency following v/c measurer with a simple circuit. When two (or more) different frequencies need be detected, two (or more) adaptive digital filters having different frequency detecting properties may be incorporated in the v/c measurer 8, so that the measurer 8 can detect each of the different frequencies.

Figure 12:
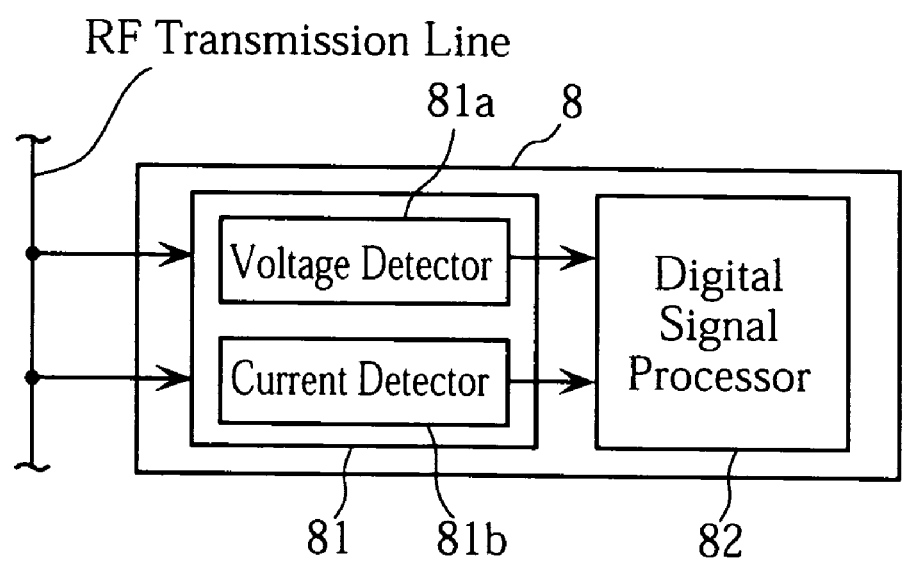
FIG. 12 is a block diagram showing a voltage/current measurer incorporating an adaptive digital filter according to the present invention.
Figure 13:
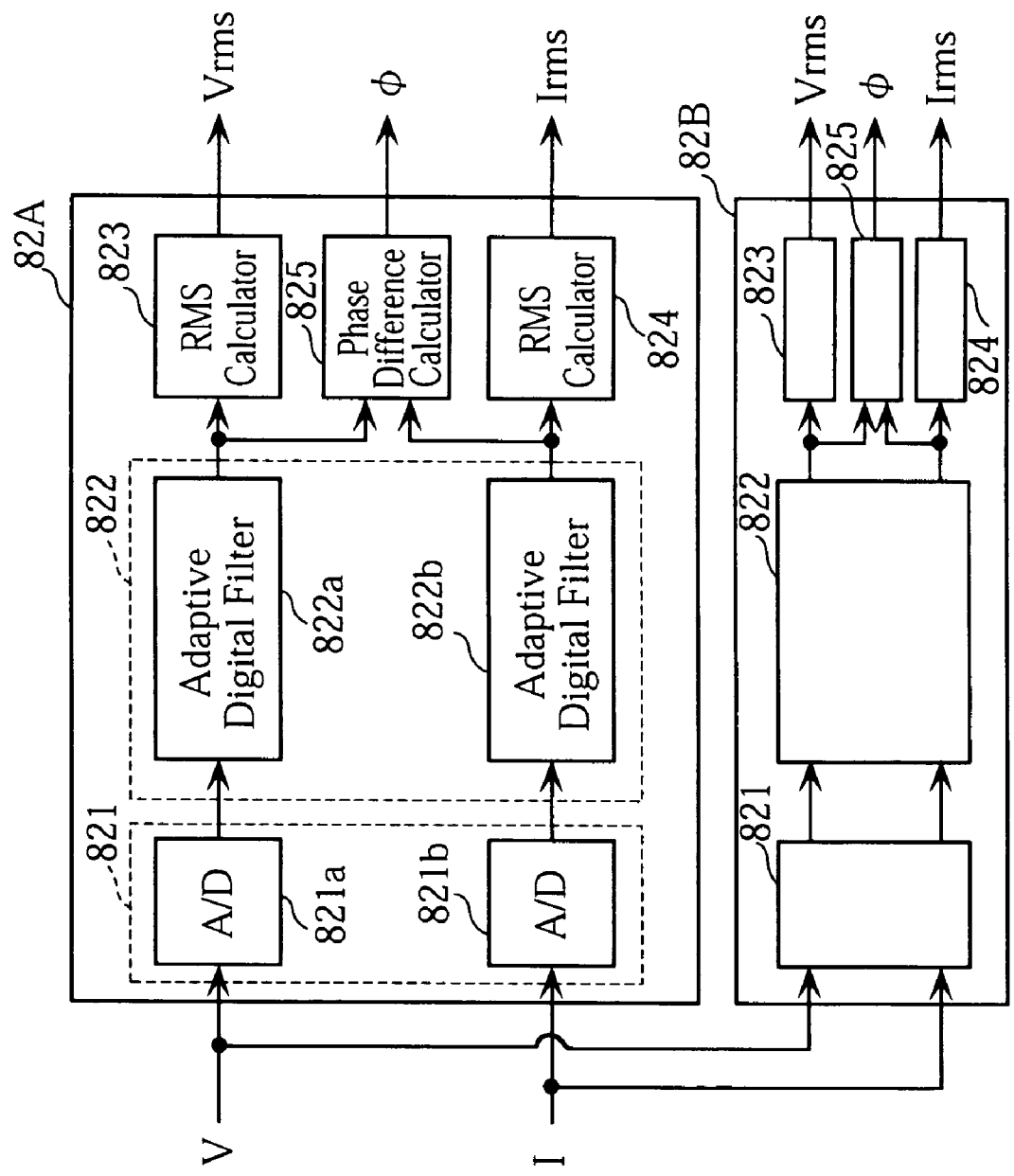
FIG. 13 is a block diagram showing a digital signal processing unit.

FIG. 12 is a block diagram illustrating the v/c measurer 8 incorporating an adaptive digital filter according to the present invention. FIG. 13 is a block diagram illustrating a digital signal processing unit.

As shown in FIG. 12, the v/c measurer 8 includes an analog signal processing unit 81 and a digital signal processing unit 82. The analog signal processing unit 81 includes a voltage detector 81a for detecting alternating voltage signals and a current detector 81b for detecting analog alternating current signals. The digital signal processing unit 82 converts analog signals (alternating voltage and current signals outputted from the unit 81) into digital signals. Based on these digital signals, the unit 82 calculates a root-mean square value Vrms of the voltage signal, a root-mean square value Irms of the current signal, and a phase difference $\phi$ between the voltage signal and the current signal.

The v/c measurer 8 measures signals (voltage signals and current signals) of two different frequencies (13.56 MHz and 2 MHz, for example). Correspondingly, the digital signal processing unit 82 includes a first digital signal processing section 82A for 13.56 MHz and a second digital signal processing section 82B for 2 MHz. The first section 82A includes an analog to digital (A/D) converter 821 for analog signals from the processing unit 81, a digital filter 822 for extracting an alternating signal of a required frequency from digital signals outputted from the converter 821, an RMS calculator 823 for calculating a root-mean square value Vrms of the voltage signal, an RMS calculator 824 for calculating a root-mean square value Irms of the current signal, and a phase difference calculator 825 for calculating the phase difference $\phi$ between the voltage signal and the current signal. The second digital signal processing section 82B has the same arrangements as the first digital processing section 82A.

The A/D converter 821 includes an A/D converting circuit 821a for voltage signals and an A/D converting circuit 821b for current signals. The digital filter 822 consists of two adaptive digital filters 822a and 822b. The digital filter 822a extracts a voltage signal of a required frequency, while the other digital filer 822b extracts a current signal of a required frequency. The required frequency refers to the frequency of the RF signal outputted from the power supply 6.

Figure 14:
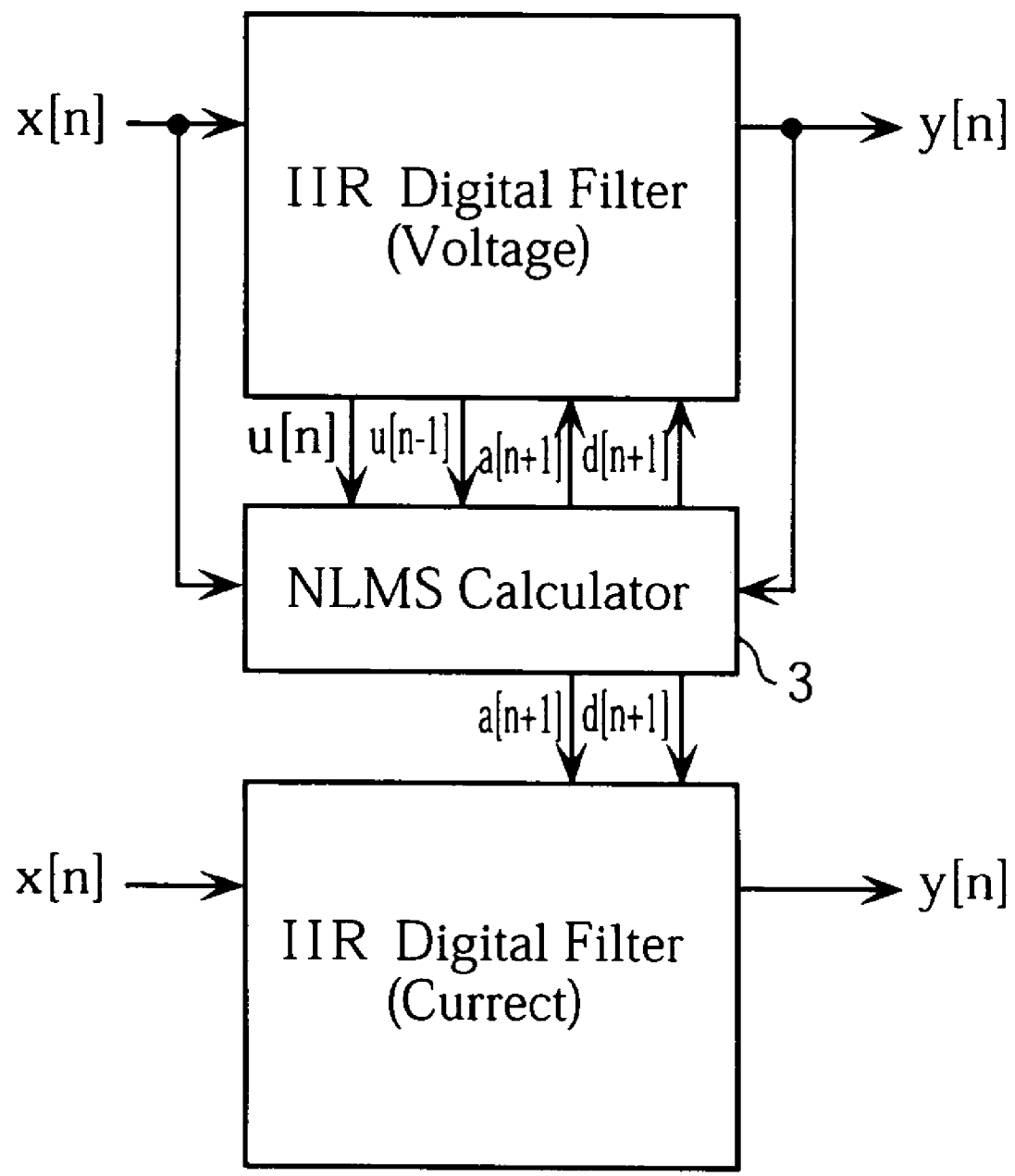
FIG. 14 is a block diagram showing basic components of a digital filter.

The adaptive digital filters 822a, 822b are the same as the digital filter 1 shown in FIG. 1. These two filters 822a, 822b have the same following frequency, and therefore they can share the NLMS calculator, as shown in FIG. 14. In the illustrated example, the lower digital filter (for current) uses the NLMS calculator 3 of the upper digital filter (for voltage). The renewal values a[n+1] and d[n+1] outputted from the NLMS calculator 3 are inputted to the upper and the lower digital filters.

The second digital signal processing section 82B (for 2 MHz) has the same arrangements as the first digital signal processing section 82A described above.

The adaptive digital filter of the present invention is designed to follow the input alternating signal by causing the coefficient a[n] to converge to minimize the difference between the input sampling data x[n] and the output sampling data y[n]. Therefore, if the same adaptive digital filters are used for the first and the second digital signal processing sections 82A-82B, the two digital filters may follow the same frequency. In other words, both digital filters may extract voltage or current signals of the same frequency, that is, either 13.56 MHz or 2 MHz.

This problem can be overcome by imposing restrictions on the converging value of the coefficient a[n] of the filter 822. With the restrictions, it is possible to cause the filter 822 of the first section 82A to follow 13.56 MHz, while causing the filter 822 of the second section 82B to follow 2 MHz.

Figure 15:
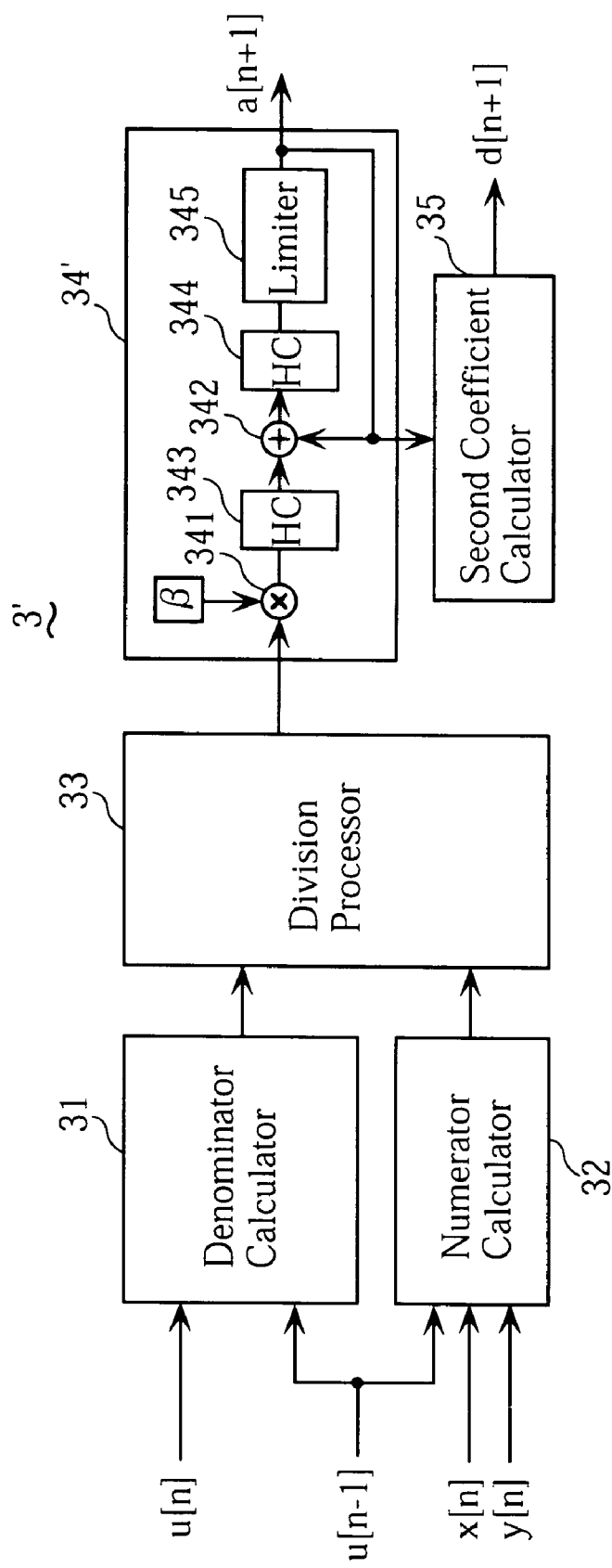

FIG. 15 is a block diagram showing an NLMS calculator provided with restricting means for the converging value of the coefficient a[n].

The illustrated calculator 3' is the same as the calculator 3 shown in FIG. 2 except that a coefficient restricting circuit or limiter 345 is provided next to the data holding circuit 344 of the first coefficient calculating unit 34. The denominator calculating unit 31, the numerator calculating unit 32, the division processing unit 33, and the second coefficient calculating unit 35 are the same as those shown in FIG. 2, so that their internal components are not shown in FIG. 15.

The limiter 345 sets an upper bound Amax and a lower bound Amin for the coefficient a. If the value of the coefficient a[n] stored in the data holding circuit 344 falls in the range defined by the upper bound Amax and the lower bound Amin (Amin≦a[n]≦Amax), the value of the coefficient a[n] is outputted. If Amax<a[n], the upper bound value Amax is outputted. If a[n]<Amin, the lower bound value Amin is outputted.

Figure 16:
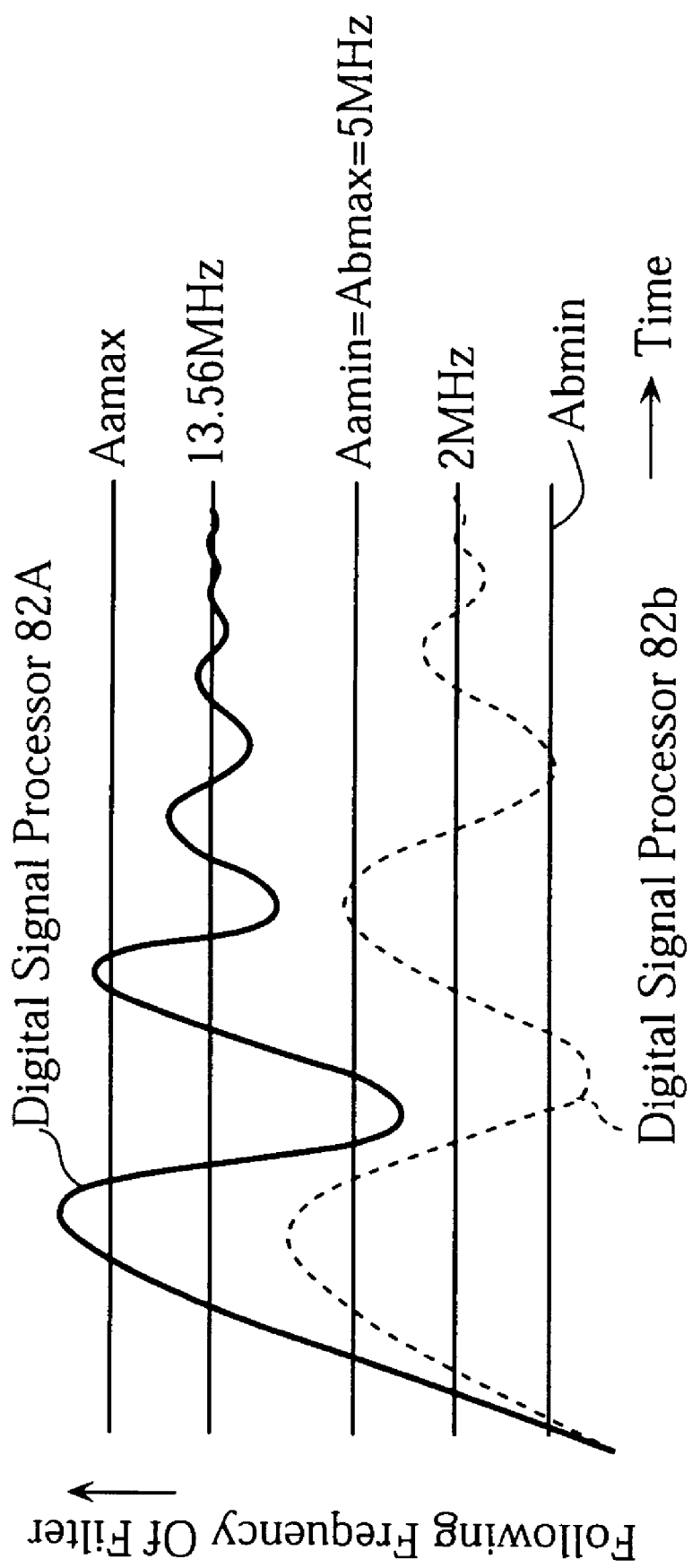
Figure 17:
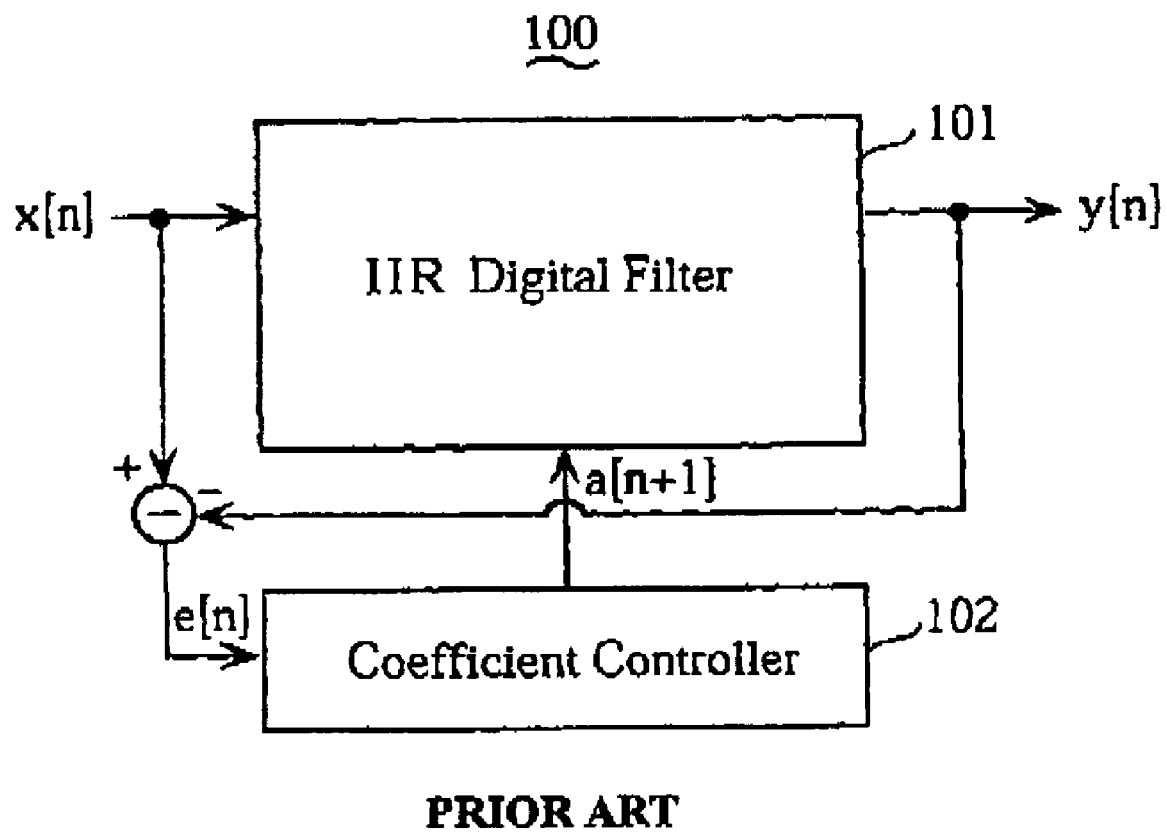
FIG. 17 is a block diagram showing a conventional adaptive digital filter.
Figure 18:
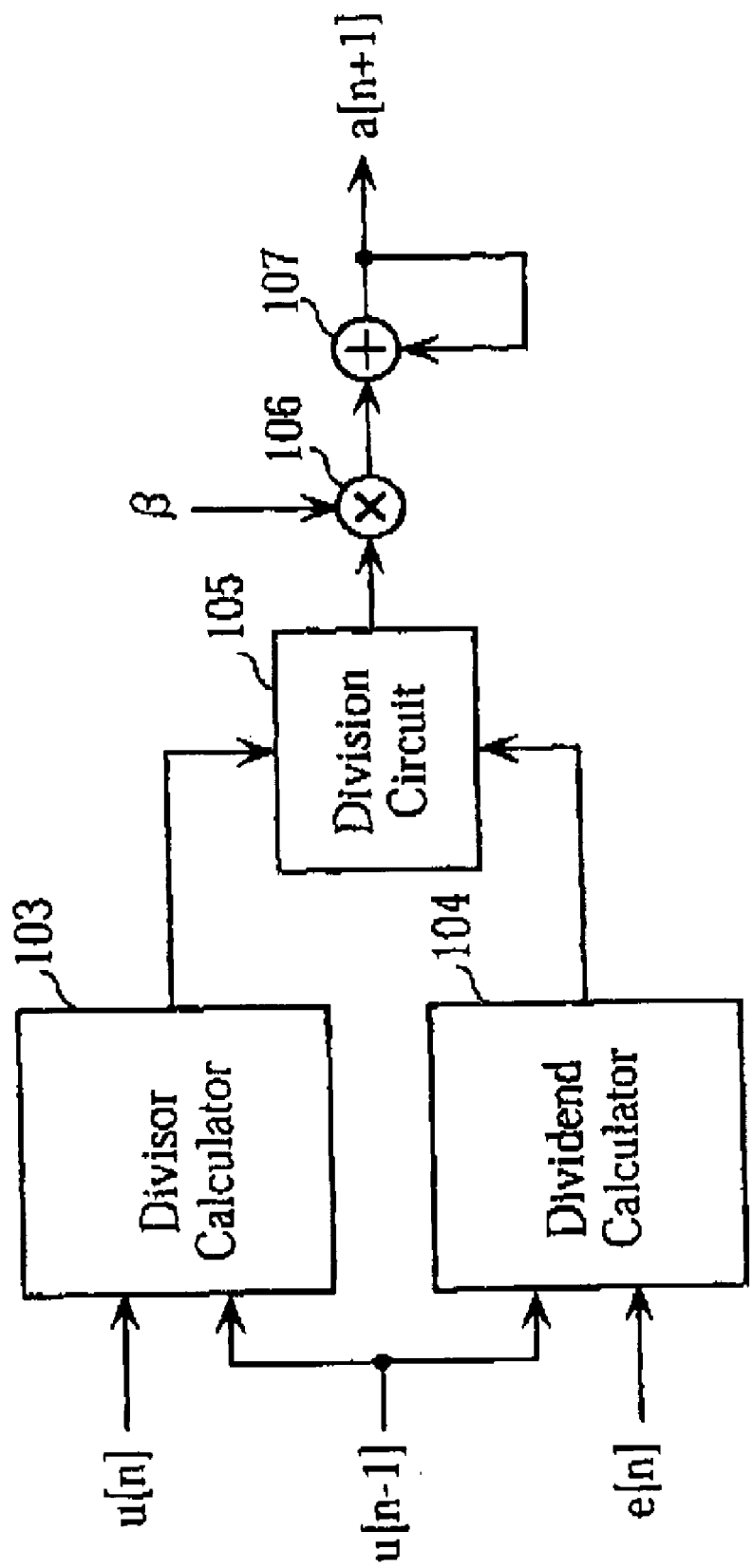
FIG. 18 is a block diagram showing the coefficient controller of the conventional digital filter.

As an example, the limiter 345 for the first digital signal processing section 82A may have a lower bound Amin greater than 2 MHz, say, Amin=5 MHz, while the other limiter 345 for the second digital signal processing section 82B may have an upper bound Amax=5 MHz. With such an arrangement, the digital filter 822 of the first section 82A only follows a frequency greater than 5 MHz, the other digital filter 822 of the second section 82B only follows a frequency lower than 5 MHz. Accordingly, as shown in FIG. 16, the first section 82A properly detects a voltage or current signal of 13.56 MHz, while the second section 82B properly detects a voltage or current signal of 2 MHz.

With the use of the v/c measurer 8 shown in FIG. 12, the voltage detector 81a detects the voltage signal at the input terminal of the plasma chamber 9 (the voltage signal is supplied from the RF power supply). After required analog processing (level adjustment, noise removing, etc.) is performed, the voltage signal is inputted to the digital signal processing unit 82. In the unit 82, the analog voltage signal is converted into a digital voltage signal (sampling data V[n]) by the A/D converter 821a of the first section 82A. Then, the filter 822a extracts 13.56 MHz voltage signal, which is inputted to the RMS calculator 823 and the phase difference calculator 825. Likewise, the A/D converter 821 of the second section 82B converts the analog voltage signal into a digital voltage signal (sampling data V[n]). Then, the filter 822 extracts 2 MHz voltage signal, which is inputted to the RMS calculator 823 and the phase difference calculator 825.

The current detector 81a of the analog signal processing unit 81 detects the current signal at the input terminal of the plasmas chamber 9. After the above-mentioned analog signal processing is performed, the current signal is inputted to the digital signal processing unit 82. In the unit 82, the analog current signal is converted into a digital current signal (sampling data I[n]) by the A/D converter 821b of the first section 82A. Then, the digital filter 822b extracts 13.56 MHz current signal, which is inputted to the RMS calculator 824 and the phase difference calculator 825. Likewise, the A/D converter 821b of the second section 82B converts the analog current signal into a digital current signal (sampling data I[n]). Then, the digital filter 822b extracts 2 MHz current signal, which is inputted to the RMS calculator 824 and the phase difference calculator 825.

Then, the RMS calculator 823 of the first section 82A generates and outputs digital data representing the root-mean square value Vrms of the 13.56 MHz voltage signal V, while the RMS calculator 824 generates and outputs digital data representing the root-mean square value Irms of the 13.56 MHz current signal I. The phase difference calculator 825 calculates the phase difference $\phi$ between the voltage signal V and the current signal I. Then, the calculator 825 generates and outputs digital data representing the phase difference $\phi$.

Further, the RMS calculator 823 of the second section 82B generates and outputs digital data representing the root-mean square value Vrms of the 2 MHz voltage signal V, while the RMS calculator 824 generates and outputs digital data representing the root-mean square value Irms of the 2 MHz current signal I. The phase difference calculator 825 calculates the phase difference $\phi$ between the voltage signal V and the current signal I. Then, the calculator 825 generates and outputs digital data representing the phase difference $\phi$.

As described above, it is advantageous to use a limiter for restricting the numerical range of the renewal value a[n+1] of the coefficient a. The limiter may have an upper bound or a lower bound or both.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. An adaptive digital filter comprising:
a filtering circuit including a delay circuit having a coefficient a defined by a fundamental formula: $a[n+1]=a[n]+\beta \cdot e[n] \cdot q[n]/p[n]$, where $\beta$ is a factor having a number greater than 0 and smaller than 2, e[n] is a difference between a filter input and a filter output, $q[n]=u[n-1]$, and $p[n]=u[n]^2+u[n-1]^2$, the u[n] being an input to the delay circuit, the u[n−1] being an output from the delay circuit;
a coefficient renewal circuit that calculates a renewal value of the coefficient a upon input of sampling data to the filtering circuit and that renews the coefficient a by utilizing the calculated renewal value;
wherein the coefficient renewal circuit calculates $2^m$ (m is an integer) greater than p[n] in the fundamental formula, and also calculates the renewal value of the coefficient a in accordance with an execution formula: $a[n+1]=a[n]+\beta \cdot e[n] \cdot q[n]/2^m$ in place of the fundamental formula,
wherein $2^m$ in the execution formula is a minimum value greater than the p[n],
wherein the coefficient renewal circuit calculates the renewal value of the coefficient a by a fixed-point system, the coefficient renewal circuit comprising:
a first calculator that detects an uppermost digit with a 1 set therein among digits of binary data representing the p[n], and calculates $2^m$ whose binary representation includes only a single 1 placed in a digit one higher than said uppermost digit;
a bit shifting circuit for shifting respective bits of binary data representing a dividend divided by the p[n] in the fundamental formula, the shifting being performed toward a lower digit side by m bits to produce new binary data; and
a second calculator that calculates the renewal value of the coefficient a by using said new binary data.

2. The adaptive digital filter according to claim 1, wherein the coefficient a determines a single frequency to pass through the filtering circuit.

3. The adaptive digital filter according to claim 1, further comprising a coefficient restricting circuit for restricting the coefficient a renewed by the coefficient renewal circuit so that the renewed coefficient falls in a prescribed numerical range.

4. An adaptive digital filter comprising:
a filtering circuit including a delay circuit and having a coefficient a defined by a fundamental formula: $a[n+1]=a[n]+\beta \cdot e[n] \cdot q[n]/p[n]$, where $\beta$ is a factor having a number greater than 0 and smaller than 2, e[n] is a difference between a filter input and a filter output, $q[n]=u[n-1]$, and $p[n]=u[n]^2+u[n-1]^2$, the u[n] being an input to the delay circuit, the u[n−1] being an output from the delay circuit;
a coefficient renewal circuit that calculates a renewal value of the coefficient a upon input of sampling data to the filtering circuit and that renews the coefficient a by utilizing the calculated renewal value;
wherein the coefficient renewal circuit calculates $2^m$ (m is an integer) greater than p[n] in the fundamental formula, and also calculates the renewal value of the coefficient a in accordance with an execution formula: $a[n+1]=a[n]+\ominus \cdot c[n] \cdot q[n]/2^m$ in place of the fundamental formula,
wherein $2^m$ in the execution formula is a minimum value greater than the p[n],
wherein the coefficient renewal circuit calculates the renewal value of the coefficient a by a floating-point system, the coefficient renewal circuit comprising:
a data extracting circuit for extracting exponent data from each of binary data representing the p[n] and binary data representing a dividend divided by the p[n] in the fundamental, formula;
an exponent data generating circuit for generating increment data based on the extracted exponent data of the p[n], the increment data being greater than the extracted exponent data of the p[n] by 1;
a subtracting circuit for calculating subtraction data by subtracting the increment data from the extracted exponent data of the dividend;
a data changing circuit for changing the dividend by replacing exponent data of binary data representing the dividend with the subtraction data;
and a coefficient calculating circuit for calculating the renewal value of the coefficient a by using binary data representing the changed dividend.

5. The adaptive digital filter according to claim 4, wherein the coefficient a determines a single frequency to pass through the filtering circuit.

6. The adaptive digital ifilter according to claim 4, further comprising a coefficient restricting circuit for restricting the coefficient a renewed by the coefficient renewal circuit so that the renewed coefficient falls in a prescribed numerical range.

* * * * *